United States Patent
Okazaki et al.

US 6,269,999 B1
(45) Date of Patent: Aug. 7, 2001

(54) SEMICONDUCTOR CHIP MOUNTING METHOD UTILIZING ULTRASONIC VIBRATIONS

(75) Inventors: Tomohiro Okazaki, Beppu; Kenji Masumoto, Hiji-machi; Mutsumi Masumoto; Katsumi Yamaguchi, both of Beppu, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/632,181

(22) Filed: Aug. 3, 2000

(30) Foreign Application Priority Data

Aug. 6, 1999 (JP) .................................. 11-223321

(51) Int. Cl.[7] ............... B23K 1/06; B23K 5/20; B23K 26/10
(52) U.S. Cl. ............... 228/110.1; 228/106; 228/262; 438/120
(58) Field of Search ............... 228/110.1, 106, 228/180.22, 262, 1.1, 18; 438/120

(56) References Cited

U.S. PATENT DOCUMENTS 4,017,886 * 4/1977 Tomono et al. .
4,796,132 * 1/1989 Dekura et al. .
5,250,469 * 10/1993 Tanaka et al. .
5,525,545 * 6/1996 Grube et al. .
5,669,545 * 9/1997 Pham et al. .
5,814,894 * 9/1998 Igarashi et al. .
5,930,666 * 7/1999 Pankove .

* cited by examiner

Primary Examiner—Tom Dunn
Assistant Examiner—Colleen P. Cooke
(74) Attorney, Agent, or Firm—Bret J. Petersen; Frederick J. Telecky, Jr.

(57) ABSTRACT

A semiconductor chip mounting method to prevent the occurrence of particles created while mounting the semiconductor chip onto a substrate using ultrasonic thermocompression bonding. The mounting method of the present invention utilizing ultrasonic vibrations involves the following steps: a semiconductor chip having conductive bumps on its main surface is held by its back via an elastic film using a suction tool having a suction hole, the semiconductor chip is positioned against a substrate provided with connection wires corresponding to said conductive bumps, and the semiconductor chip is mounted onto the substrate in such a manner that the conductive bumps connect to said connection wires, and ultrasonic vibrations are applied from the suction tool to the semiconductor chip via said film while said semiconductor chip is being pressed against said substrate in order to bond said conductive bumps with said connection wires.

15 Claims, 4 Drawing Sheets

SEMICONDUCTOR CHIP MOUNTING METHOD UTILIZING ULTRASONIC VIBRATIONS

FIELD OF THE INVENTION

The present invention pertains to a method for mounting a semiconductor chip onto a substrate utilizing ultrasonic vibrations.

BACKGROUND OF THE INVENTION

As a method for mounting a semiconductor chip onto a substrate, a method referred to as flip-chip mounting has been widely adopted. In the case of flip-chip mounting, a body provided with several conductive bumps, that is, bumps usually made of gold, serving as connecting terminals is placed face down onto the surface (referred to as main surface, hereinafter) where circuits are formed on a semiconductor chip, that is, with the main surface facing the substrate, in order to bond said conductive bumps directly to the wires on the substrate. In flip-chip mounting, a method referred to as ultrasonic thermocompression bonding has long been well known as a method for bonding said conductive bumps to the wires on the substrate.

In the ultrasonic thermocompression bonding method, a semiconductor chip is held by suction using a vacuum suction tool and placed over the area where the bumps are to be mounted onto the wires formed on the substrate. When bonding the gold bumps onto the wires, a fixed amount of pressure is applied to the semiconductor chip using a suction tool, and the substrate is heated at the same time. Under said conditions, ultrasonic vibrations of a prescribed frequency are applied to the semiconductor chip via said suction tool. The gold bumps on the semiconductor chip are well bonded to lands on the substrate by said pressure, heat, and ultrasonic vibrations.

In order to transmit the energy of the ultrasonic vibrations applied via said suction tool to the conductive bumps efficiently, it is important to bring the suction tool and the semiconductor chip into close contact by means of vacuum suction. However, a minute gap may be created between the suction surface of the suction tool and the back of the semiconductor chip placed against the suction surface, resulting in a drop in suction power. This drop in suction power not only reduces the energy of the ultrasonic vibrations applied to the gold bumps but also creates another problem.

That is, when the suction power of the suction tool drops, the semiconductor chip can no longer follow the ultrasonic vibrations applied to the tool, resulting in the problem that tip of the suction tool ends up abrading the surface of the semiconductor chip due to friction. Some of the scraped-off fine silicon particles stick to the back of the semiconductor chip, land on the substrate, and may even be incorporated into a device eventually.

In addition, even when the aforementioned drop in the suction power is not present, the semiconductor chip stops following the vibrations of the suction tool when or immediately before the conductive bumps become fixed to the wires on the substrate. In such case, also, the aforementioned problem of chip abrading occurs.

The particles stuck to the semiconductor chip have potential for causing serious problems depending on the ultimate use of the semiconductor chip. For example, a preamplifier bare chip to be mounted on an actuator in a hard disk device may be mentioned. Said scraped-off particles (they are 0.1–5 $\mu$m or so in size) stuck to the semiconductor chip come loose inside the device due to vibrations caused by revolution of the magnetic disk and ultimately fall onto the disk. Because the magnetic head floats at a distance of 50 $\mu$m or less from the disk surface, said scraped-off particles on the disk seriously affect the function of the hard disk drive.

Therefore, the purpose of the present invention is to prevent said problems caused by said abraded particles when mounting said semiconductor chip, by preventing creation of the particles by abrasion of the chip while it is being mounted onto the substrate using the ultrasonic thermocompression bonding method.

SUMMARY OF THE INVENTION

The semiconductor chip mounting method utilizing ultrasonic vibrations of the present invention involves a step in which a semiconductor chip having conductive bumps serving as connecting terminals on its main surface is held by its back via an elastic film using a suction tool having a suction hole; a step in which said semiconductor chip is positioned against a substrate provided with connection wires corresponding to said conductive bumps, and said semiconductor chip is mounted onto said substrate in such a manner that said conductive bumps connect to said connection wires; and a step in which ultrasonic vibrations are applied from said suction tool to said semiconductor chip via said film while said semiconductor chip is being pressed against said substrate in order to bond said conductive bumps with said connection wires.

In addition, the aforementioned mounting method may also involve a step in which a hole is created on said film at the position corresponding to the suction hole of said suction tool when holding said semiconductor chip by suction via said film using said suction tool.

In addition, the semiconductor chip mounting method utilizing ultrasonic vibrations of the present invention involves a step in which a semiconductor chip having conductive bumps serving as connecting terminals on its main surface is positioned against a substrate provided with connection wires corresponding to said conductive bumps, and said semiconductor chip is mounted onto said substrate in such a manner that said conductive bumps connect to said connection wires and a step in which ultrasonic vibrations are applied to said semiconductor chip from a pressing member via an elastic film while said semiconductor chip is being pressed against said substrate from the back of said semiconductor chip via said elastic film using said pressing member in order to bond said conductive bumps with said connection wires.

In the respective mounting method above, it is desirable that said film be shaped like a long tape, and an unused area of said film is fed into the space between said suction tool and the back of said semiconductor chip every time a new semiconductor chip is mounted.

In addition, it is desirable that the step for bonding said conductive bumps with said connection wires be carried out while applying a fixed level of tension to said film. Said tension improves the oneness of the suction tool (pressing member) with the semiconductor chip, so that the energy of the ultrasonic vibrations can be transmitted more efficiently.

In addition, it is desirable that the step for bonding said conductive bumps with said connection wires be carried out while applying heat to said substrate.

Furthermore, it is desirable that said film be a 10–50 $\mu$m thick resin film, and that fluororesin or straight chain type polyimide resin be utilized as the material of said film.

An embodiment of the present invention will be explained below along with figures. In the semiconductor chip mounting method pertaining to the present embodiment, a suction tool of the kind shown in FIG. 1 is utilized. The suction tool 10 is one of the constituents of a device, such as a flip-chip bonding device, used to mount a semiconductor chip onto a substrate.

The suction tool 10 has a suction nozzle 11 whose tip constitutes a suction surface 11a for the semiconductor chip. The semiconductor chip is held onto said suction surface 11a by means of vacuum suction achieved by the suction power obtained through a suction hole at the tip of the suction nozzle. An ultrasonic horn 12 for supplying ultrasonic vibrations is connected halfway up the suction nozzle 11. The ultrasonic horn 12 supplies lateral vibrations of a specific frequency to the suction nozzle 11 for a prescribed period of time. The tip of the suction nozzle 11 and ultimately the semiconductor chip held there by means of vacuum suction are vibrated microscopically in the lateral direction by said vibrations. As will be described later, the semiconductor chip is bonded to the substrate by said vibrations, pressure, and heat.

Although it is not shown in FIG. 1, the present invention further utilizes an elastic film and a feeder device thereof during its application. The elastic film is configured as a long tape-like shape and is taken up on a reel. The elastic film is positioned between the suction surface 11a of the suction nozzle and the semiconductor chip when the ultrasonic vibrations are applied to the semiconductor chip via said suction nozzle 11. The intervention by the elastic film prevents the semiconductor chip from coming into direct contact with the suction nozzle, so that the back of the semiconductor chip will not be abraded by the suction surface 11a.

On the other hand, the elastic film must be capable of efficiently transmitting the energy of the vibrations applied to the suction nozzle 11 to the semiconductor chip. In order to transmit the energy of said vibrations efficiently, the thickness of the elastic film and a close-contact trait for making the suction nozzle and the semiconductor chip into a single body become important. In addition, strength to stand up to said vibrations and thermal tolerance are needed. The thickness of the elastic film, which the present inventors have confirmed through experiments to meet these requirements, falls into a range of 10–50 $\mu$m. Furthermore, the distance the suction nozzle travels due to the ultrasonic vibrations is 0.5–1.5 $\mu$m or so. In addition, fluororesin (elasticity: approximately 1.7 MPa) and straight chain type polyimide resin (elasticity: approximately 6370 MPa) were found to be suitable as the material of said film.

In the elastic film feeder device, said tape-like film is mounted onto the device in such a manner that it is positioned in front of the suction surface 11a of the suction nozzle. Every time the step of mounting a semiconductor chip onto the substrate begins, the feeder device drives said reel in such a manner that a new surface of the film is supplied to the front of said suction surface 11a. Although the present invention is not restricted by any specific configuration of the feeder device, it is preferred that the feeder be fixed to said suction tool 10.

Next, the semiconductor chip mounting steps in the embodiment of the present invention will be explained one by one along with FIGS. 2, 3, and 4. FIG. 2 is a flowchart showing the semiconductor chip mounting method in the embodiment; and the steps A through F shown in FIGS. 3 and 4 are step diagrams corresponding to the respective steps in FIG. 2. In the first step 101, a film 30 is taken up by a reel as a feeder device is driven, and a new film surface is supplied to the front of a suction surface 11a of a suction nozzle 11 (Step (A)). The suction nozzle 11 is moved to the position where a through-hole tool 31 is provided while the film 30 is carried along in front of said suction nozzle. The through-hole tool 31 contains a needle pin with a sharp tip whereby a hole is created in the film 30 at the position corresponding to the suction hole 11b on the suction nozzle. That is, in Step 102, either the suction nozzle 11 or the through-hole tool 31 is moved relative to the other in order to create a hole in the film 30 (Step (B)). In such a case, it is desirable to bring the film 30 into contact with the suction surface 11a in order to prevent the position of the film from shifting relative to the suction surface 11a after the hole is created, and to apply a fixed level of tension to the film.

In the next step 103, the suction nozzle 11 is moved to the position to which a semiconductor chip 32 is supplied, and the suction tool is activated in order to hold the semiconductor chip 32 by means of vacuum suction (Step (C)). Although the film 30 is positioned between the suction nozzle 11 and the semiconductor chip 32, the suction power of the suction tool is transmitted to the semiconductor chip 32 through the hole created in the film 30 in the previous step. As a result, not can only the semiconductor chip 32 be held by suction, but also the suction surface 11a can be prevented from coming into direct contact with the semiconductor chip 32.

In the next step 104, the semiconductor chip 32 held by suction by the suction nozzle 11 is carried onto a substrate 33, where it is to be mounted and positioned there (Step (D) in FIG. 4). That is, gold bumps 32a on the semiconductor chip 32 are aligned with wires 33a on the substrate 33 fixed onto a mount 34, and the suction nozzle 11 is lowered to bring them into contact. At this time, the suction nozzle 11 applies a prescribed amount of pressure in order to press the semiconductor chip 32 against the substrate 33. Here, the substrate 33 is heated to a prescribed temperature. In the embodiment, the substrate 33 is the actuator substrate of the hard disk device. In addition, the substrate 33 may also be sealed into the package together with the semiconductor chip.

In Step 105, ultrasonic vibrations are applied under said conditions to the semiconductor chip 32 via the suction nozzle 11 for a prescribed amount of time (Step (E)). The gold bumps 32a are fused and bonded to the wires 33a on the substrate 33 due to said ultrasonic vibrations, the pressure by the suction nozzle 11, and the heat applied to the substrate 33. Abrading of the back of the semiconductor chip 32 never occurs when the vibrations are applied due to said intervening film 30. In addition, because the distance the suction nozzle travels due to the ultrasonic vibrations (0.5–1.5 $\mu$m or so) is sufficiently smaller than the amount of elastic deformation of the film 30 in the same direction (thickness of the film is 10 $\mu$m or greater), a shift between the suction nozzle and the semiconductor chip can be absorbed by said deformation even when the semiconductor chip 32 becomes unable to move because it is bonded to the substrate 33. In the present step, it is desirable to apply a fixed level of tension to the film 30. Once the semiconductor chip 32 is bonded to the substrate 33 in Step 105, the suction nozzle 11 is raised in Step 106 to complete the processing (Step (F)).

Next, the semiconductor chip mounting steps in another embodiment of the present invention will be explained one by one along FIGS. 5 and 6 through 8. FIG. 5 is a flowchart showing the semiconductor chip mounting method in the present embodiment; and the steps (A) through (G) shown in FIGS. 6 through 8 are step diagrams corresponding to the respective steps in FIG. 5. Unlike the previous embodiment, the semiconductor chip mounting steps in the present embodiment do not include the step for creating a hole in the film.

In the first step 501, the suction nozzle 11 is moved to the position to which the semiconductor chip 32 is supplied, and the suction tool is activated to hold the semiconductor chip 32 by means of vacuum suction (Step (A) in FIG. 6). Unlike in the previous embodiment, no intervening film is involved here. In the next step 502, the semiconductor chip 32 held by suction by the suction nozzle 11 is carried onto a substrate 33, where it is to be mounted, and positioned there (Step (B)). That is, like in said embodiment, the gold bumps 32a on the semiconductor chip 32 are aligned with the wires 33a on the substrate 33 fixed to the mount 34, and the suction nozzle 11 is lowered to bring them into contact. Next, in Step 503, the suction holding the semiconductor chip 32 the suction nozzle 11 is stopped, the semiconductor chip 32 remains placed on the substrate 33, and the suction nozzle 11 is raised temporarily (Step (C)).

Next, in Step 504, the film 30 is positioned above the semiconductor chip 32 and in front of the suction nozzle 11 (Step (D) in FIG. 7). Then, in Step 505, the suction nozzle 11 is lowered again to the position where the semiconductor chip 32 has been placed (Step (E)). At this time, said film 30 is positioned between the suction nozzle 11 and the semiconductor chip 32, so that they are prevented from coming into direct contact. The suction nozzle 11 applies a prescribed amount of pressure in order to press the semiconductor chip 32 against the substrate 33. In addition, the substrate 33 is heated to a prescribed temperature.

In Step 506, ultrasonic vibrations are applied under said conditions to the semiconductor chip 32 via the suction nozzle 11 for a prescribed amount of time (Step (F) in FIG. 8). The gold bumps 32a are fused and bonded to the wires 33a on the substrate 33 due to said ultrasonic vibrations, the pressure applied by the suction nozzle 11, and the heat applied to the substrate 33. Once the semiconductor chip 32 is bonded to the substrate 33 in Step 506, the suction nozzle 11 is raised in Step 507 to complete the processing (Step (G)). At this time, the feeder device operates, the film 30 is taken up onto the reel, and a new film surface is supplied in front of the suction surface 11a of the suction nozzle 11 in preparation for the next semiconductor chip to be mounted.

REFERENCE NUMERALS AND SYMBOLS AS SHOWN IN THE DRAWINGS

In the figures, 10 represents a suction tool, 11 represents a suction nozzle, 11a represents a suction surface, 11b represents a suction hole, 12 represents a ultrasonic horn, 30 represents a film, 31 represents a through-hole tool, 32 represents a semiconductor chip, 32a represents a gold bump, 33 represents a substrate, 33a represents wires, and 34 represents a mount.

DESCRIPTION OF THE EMBODIMENT

Figure 1:
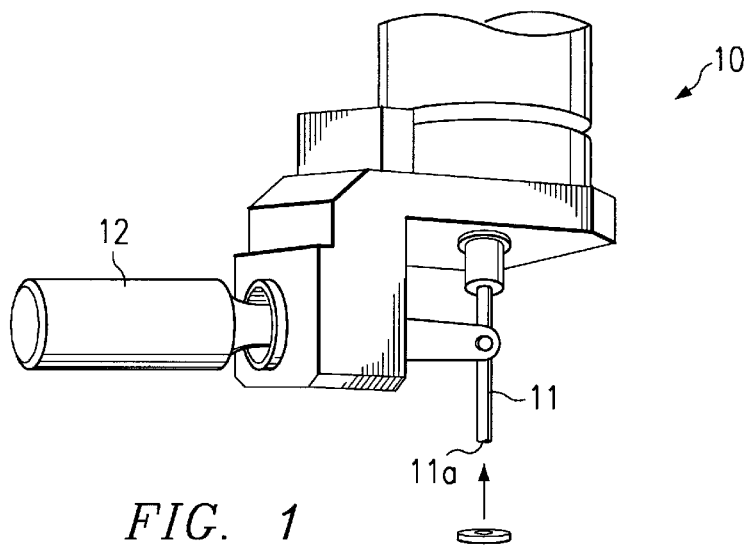
FIG. 1 is an oblique view showing an example of the suction tool used for the application of the present invention.
Figure 2:
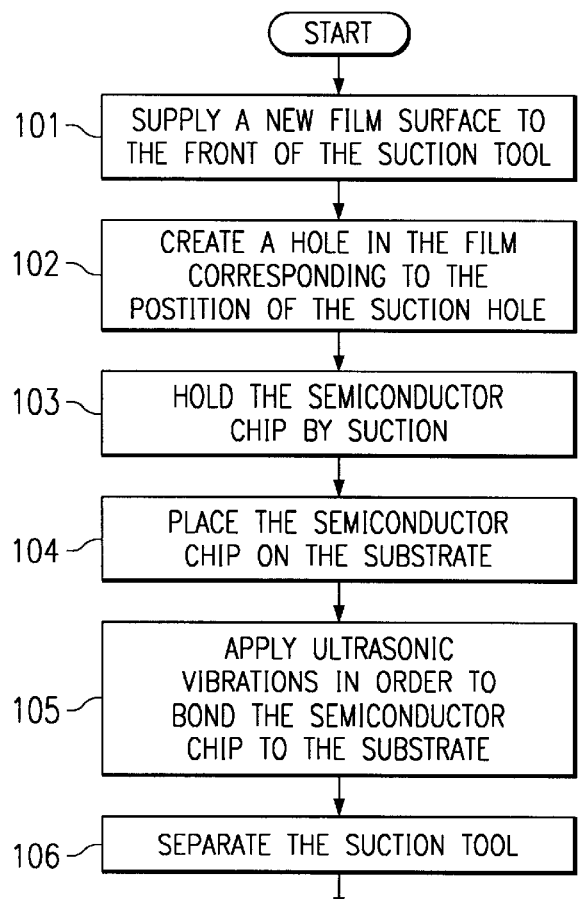
FIG. 2 is a flowchart showing the semiconductor chip mounting method in an embodiment of the present invention.
Figure 3A:
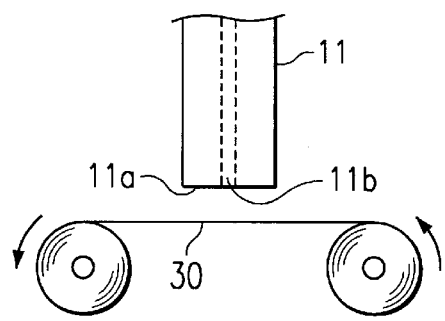
FIG. 3 are step diagrams corresponding to the respective steps in FIG. 2.
Figure 3B:
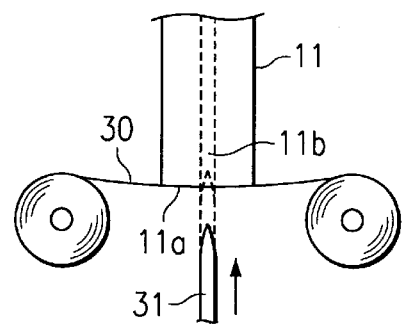
Figure 3C:
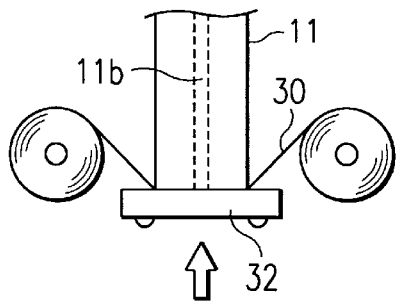
Figure 4D:
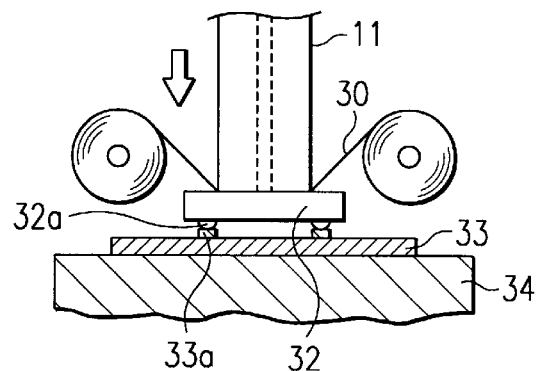
FIG. 4 are step diagrams corresponding to the respective steps in FIG. 2.
Figure 4E:
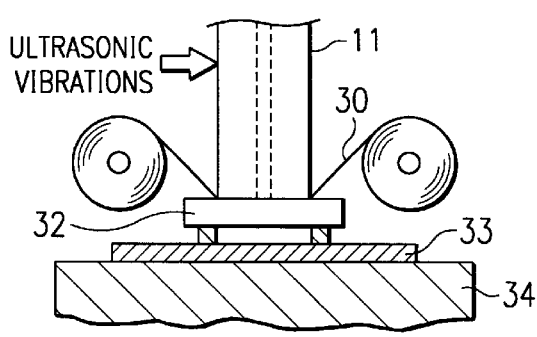
Figure 4F:
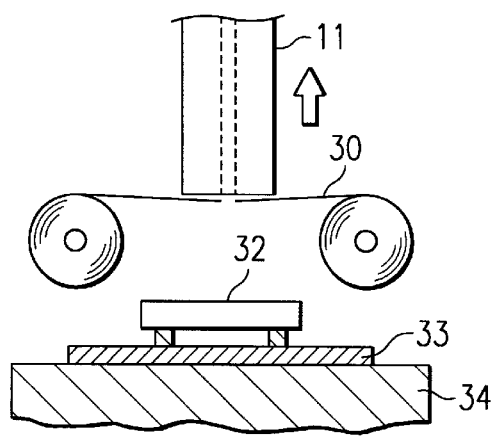
Figure 5:
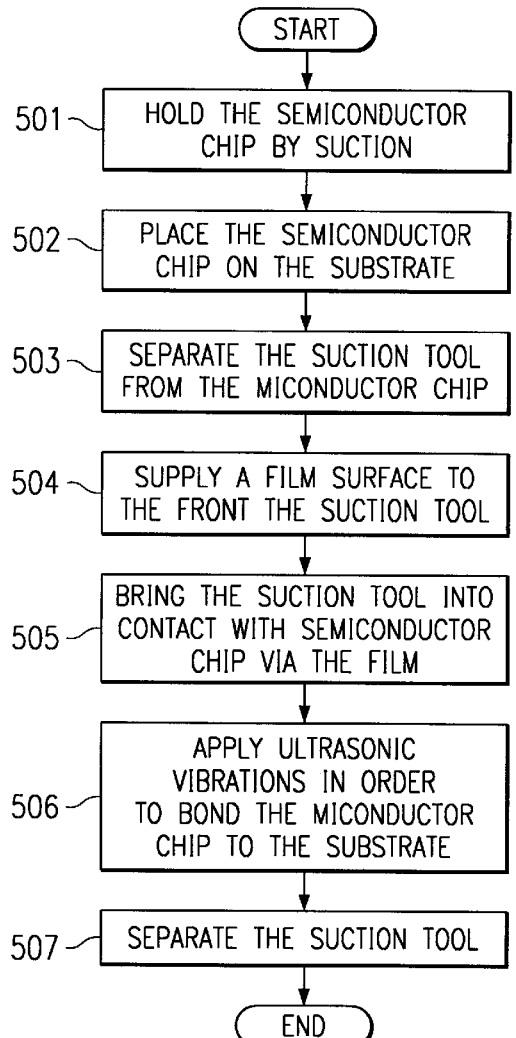
FIG. 5 is a flowchart showing the semiconductor chip mounting method in another embodiment of the present invention.
Figure 6A:
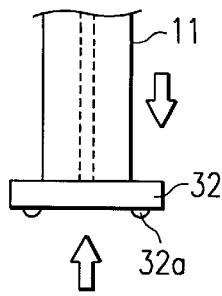
FIG. 6 has step diagrams corresponding to the respective steps in FIG. 5.
Figure 6B:
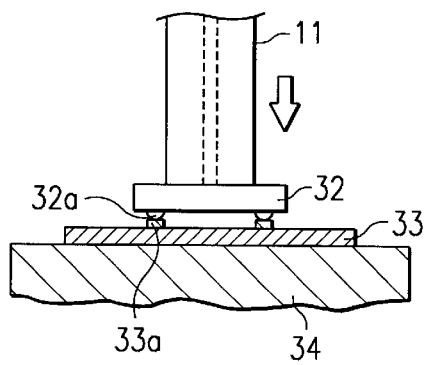
Figure 6C:
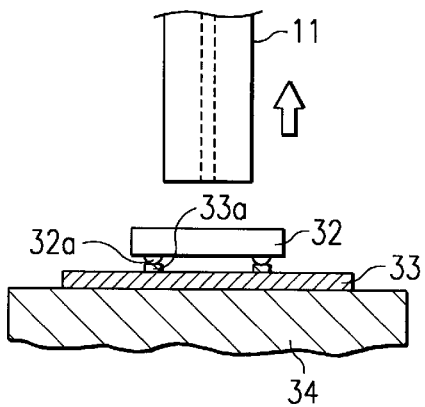
Figure 7D:
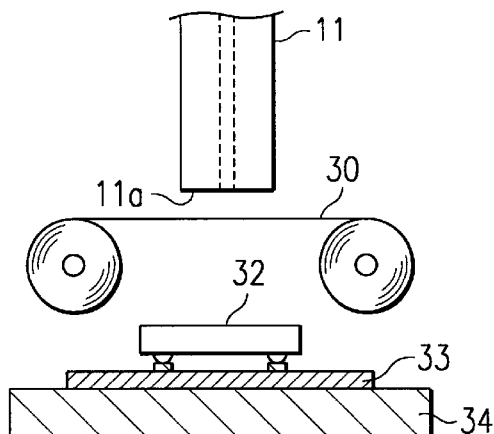
FIG. 7 has step diagrams corresponding to the respective steps in FIG. 5
Figure 7E:
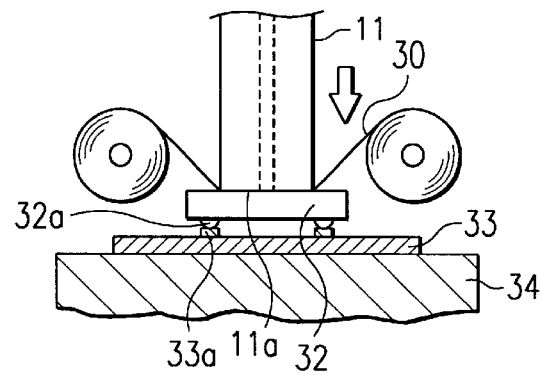
Figure 8F:
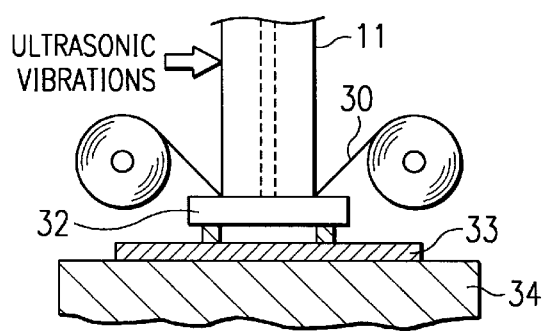
FIG. 8 has step diagrams corresponding to the respective steps in FIG. 5.
Figure 8G:
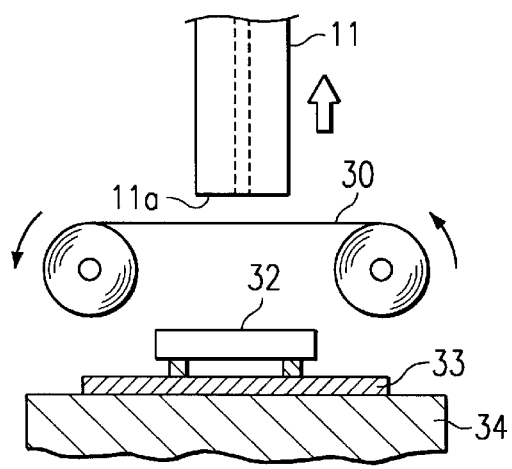

The mounting method of the present invention according to the embodiment shown in said FIG. 5 has been compared with the conventional method in which no elastic film is utilized. Conditions in the conventional method are adjusted in the manner shown in Table 1. The elastic films utilized here are a 30 $\mu$m thick fluororesin film and a 50 $\mu$m thick straight chain type polyimide resin film.

As a result, with either elastic film, not only was the same bonding strength as that of the conventional example secured, but also the creation of particles due to abrading of the semiconductor chip was avoided entirely.

Embodiments and an embodiment of the present invention have been explained above, along with figures. It is clear that the scope of the present invention is not restricted to the items described in said embodiments and embodiment. Although an example in which a long tape-like elastic film was utilized was given in the embodiments, its shape is not limited to said [shape], and it may take a sheet-like shape or other shapes. A composition other than gold, such as a thermoplastic conductive resin, may also be utilized for the conductive bumps on the semiconductor chip to be mounted onto the substrate using the method pertaining to the present invention. Said conductive bumps may be made of solder. In addition, the suction nozzle may be used for holding the semiconductor chip by suction using a film provided in advance with a hole for holding the semiconductor chip by suction.

In addition, the present invention is effective also with a configuration in which an anisotropic conductive film or paste is laid between the semiconductor chip and the substrate for bonding. In the past, there was a problem that where an anisotropic conductive paste was used for bonding, when the semiconductor chip was placed on the substrate, a portion of the paste squeezed out around the chip went upward (onto the back of the semiconductor chip) and stuck to the suction nozzle. When the elastic film pertaining to the present invention is utilized, a secondary effect can be obtained in which the paste is prevented from sticking to the suction nozzle.

As it has been described above, when mounting the semiconductor chip onto the substrate using the ultrasonic thermocompression bonding method, the occurrence of said particles due to abrading of the semiconductor chip can be prevented, so that said problems caused by said abraded particles created when said semiconductor chip was mounted onto the substrate can be resolved.

TABLE 1

| Requirement | Conventional example | Embodiment |
| --- | --- | --- |
| Substrate temperature [° C.] | 150 | 200 |
| Load [kgf] | 0.91 | 1.5 |
| Ultrasonic wave output [W] | 0.75 | 1.5 |
| Time [Sec.] | 0.1 | 1.0 |

What is claimed is:
1. Semiconductor chip mounting method utilizing ultrasonic vibrations comprising the steps of:
 holding a semiconductor chip having conductive bumps serving as connecting terminals on its main surface by its back via an elastic film using a suction tool having a suction hole, positioning said semiconductor chip against a substrate provided with connection wires corresponding to said conductive bumps, applying ultrasonic vibrations from said suction tool to said semiconductor chip via said film while said semiconductor chip is being pressed against said substrate in order to bond said conductive bumps with said connection wires.

2. Semiconductor chip mounting method utilizing ultrasonic vibrations described in claim 1 further comprising creating a hole on said film at the position corresponding to the suction hole of said suction tool when holding said semiconductor chip by suction via said film using said suction tool.

3. Semiconductor chip mounting method utilizing ultrasonic vibrations comprising the steps of:

positioning a semiconductor chip having conductive bumps serving as connecting terminals on its main surface against a substrate provided with connection wires corresponding to said conductive bumps, mounting said semiconductor chip onto said substrate in such a manner that said conductive bumps connect to said connection wires and applying ultrasonic vibrations to said semiconductor chip from a pressing member via an elastic film while said semiconductor chip is being pressed against said substrate from the back of said semiconductor chip via said elastic film using said pressing member in order to bond said conductive bumps with said connection wires.

4. Semiconductor chip mounting method utilizing ultrasonic vibrations described in claim 1, in which said film is shaped like a long tape, and an unused area of said film is fed into the space between said suction tool and the back of said semiconductor chip every time a new semiconductor chip is mounted.

5. Semiconductor chip mounting method utilizing ultrasonic vibrations described in claim 1, in which the step for bonding said conductive bumps with said connection wires is carried out while applying a fixed level of tension to said film.

6. Semiconductor chip mounting method utilizing ultrasonic vibrations described in claim 1, in which the step for bonding said conductive bumps with said connection wires is carried out while applying heat to said substrate.

7. Semiconductor chip mounting method utilizing ultrasonic vibrations described in claim 1, in which said film is a 10–50 $\mu$m thick resin film.

8. Semiconductor chip mounting method utilizing ultrasonic vibrations described in claim 7 in which said film is a film utilizing fluororesin.

9. Semiconductor chip mounting method utilizing ultrasonic vibrations described in claim 7 in which said film is a film utilizing straight chain type polyimide resin.

10. The semiconductor chip mounting method utilizing ultrasonic vibrations described in claim 3 in which said film is shaped like a long tape, and an unused area of said film is fed into the space between said suction tool and the back of said semiconductor chip every time a new semiconductor chip is mounted.

11. The semiconductor chip mounting method utilizing ultrasonic vibrations described in claim 10 in which the step for bonding said conductive bumps with said connection wires is carried out while applying a fixed level of tension to said film.

12. The semiconductor chip mounting method utilizing ultrasonic vibrations described in claim 11 in which the step for bonding said conductive bumps with said connection wires is carried out while applying heat to said substrate.

13. The semiconductor chip mounting method utilizing ultrasonic vibrations described in claim 12 in which said film is a 10–50 $\mu$m thick resin film.

14. The semiconductor chip mounting method utilizing ultrasonic vibrations described in claim 13 in which said film is a film utilizing fluororesin.

15. The semiconductor chip mounting method utilizing ultrasonic vibrations described in claim 13 in which said film is a film utilizing straight chain type polyimide resin.

* * * * *